United States Patent
Wang et al.

(10) Patent No.: US 12,463,046 B2
(45) Date of Patent: Nov. 4, 2025

(54) SILICON-AND-GERMANIUM ETCHING

(71) Applicant: Applied Materials, Inc., Santa Clara, CA (US)

(72) Inventors: Anchuan Wang, San Jose, CA (US); Jiayin Huang, Fremont, CA (US); Kalpana Suen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 246 days.

(21) Appl. No.: 18/128,036

(22) Filed: Mar. 29, 2023

(65) Prior Publication Data

US 2024/0332027 A1    Oct. 3, 2024

(51) Int. Cl.
*H01L 21/3065* (2006.01)
(52) U.S. Cl.
CPC ................................ *H01L 21/3065* (2013.01)
(58) Field of Classification Search
None
See application file for complete search history.

(56) References Cited

U.S. PATENT DOCUMENTS

| | | | | |
|---|---|---|---|---|
| 2015/0228495 A1* | 8/2015 | Joubert | ............ | H01L 21/31116 156/345.1 |
| 2020/0013628 A1* | 1/2020 | Chen | ................. | H01L 21/67069 |
| 2020/0027741 A1* | 1/2020 | Kal | ................... | H01L 21/67248 |
| 2020/0176320 A1* | 6/2020 | Chen | ................... | H01L 29/7827 |
| 2021/0272814 A1 | 9/2021 | Peter et al. | | |
| 2022/0254645 A1* | 8/2022 | Luan | ................ | H01L 21/32135 |
| 2022/0319930 A1 | 10/2022 | Lin et al. | | |

FOREIGN PATENT DOCUMENTS

WO    2009085672 A2    7/2009

OTHER PUBLICATIONS

Application No. PCT/US2024/010309, International Search Report and the Written Opinion, Mailed on May 8, 2024, 15 pages.

\* cited by examiner

*Primary Examiner* — Stephanie P Duclair
(74) *Attorney, Agent, or Firm* — Kilpatrick Townsend & Stockton LLP

(57) ABSTRACT

Exemplary methods of semiconductor processing may include providing a first fluorine-containing precursor to a remote plasma system of a semiconductor processing chamber. The methods may include generating plasma effluents of the first fluorine-containing precursor in the remote plasma system. The methods may include providing plasma effluents of the first fluorine-containing precursor to a processing region of the semiconductor processing chamber. The methods may include providing a second fluorine-containing precursor to the processing region of the semiconductor processing chamber. A substrate including alternating layers of material may be disposed within the processing region. The alternating layers of material may include a silicon-and-germanium-containing material. The methods may include contacting the substrate with the plasma effluents of the first fluorine-containing precursor and with the second fluorine-containing precursor. The methods may include etching the silicon-and-germanium-containing material of the alternating layers of material on the substrate.

18 Claims, 4 Drawing Sheets

SILICON-AND-GERMANIUM ETCHING

TECHNICAL FIELD

The present technology relates to semiconductor processes and materials. More specifically, the present technology relates to etching silicon-and-germanium.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. As device sizes continue to shrink, material uniformity may affect subsequent operations as well as device quality. For example, as layers of material are reduced in thickness, the removal of one layer relative to another layer may be more difficult, and a decrease in selectivity may occur.

Thus, there is a need for improved systems and methods that can be used to produce high quality devices and structures. These and other needs are addressed by the present technology.

SUMMARY

Exemplary methods of semiconductor processing may include providing a first fluorine-containing precursor to a remote plasma system of a semiconductor processing chamber. The methods may include generating plasma effluents of the first fluorine-containing precursor in the remote plasma system. The methods may include providing plasma effluents of the first fluorine-containing precursor to a processing region of the semiconductor processing chamber. The methods may include providing a second fluorine-containing precursor to the processing region of the semiconductor processing chamber. A substrate including alternating layers of material may be disposed within the processing region. The alternating layers of material may include a silicon-and-germanium-containing material. The methods may include contacting the substrate with the plasma effluents of the first fluorine-containing precursor and with the second fluorine-containing precursor. The methods may include etching the silicon-and-germanium-containing material of the alternating layers of material on the substrate.

In some embodiments, the first fluorine-containing precursor may be or include nitrogen trifluoride ($NF_3$). The second fluorine-containing precursor may be or include silicon tetrafluoride ($SiF_4$). The methods may include providing argon to the remote plasma system with the first fluorine-containing precursor. The methods may include providing a third fluorine-containing precursor to the processing region of the semiconductor processing chamber with the second fluorine-containing precursor. The third fluorine-containing precursor may be or include hydrogen fluoride (HF). The methods may include pulsing a flow rate of the third fluorine-containing precursor. The alternating layers of material may further include a silicon-containing material. The silicon-and-germanium-containing material may be etched at a selectivity relative to the silicon-containing material of greater than 10:1. A flow rate of the second fluorine-containing precursor may be maintained at less than or about 500 sccm. A temperature within the semiconductor processing chamber may be maintained at less than or about 50° C. The silicon-and-germanium-containing material may be etched at an etch rate of greater than or about 100 Å/min.

Embodiments of the present technology may encompass semiconductor processing methods. The methods may include providing a first fluorine-containing precursor and a second fluorine-containing precursor to a processing region of a semiconductor processing chamber. A substrate including alternating layers of material may be disposed within the processing region. The alternating layers of material may include a silicon-containing material and a silicon-and-germanium-containing material. The methods may include contacting the substrate with the first fluorine-containing precursor and with the second fluorine-containing precursor. The methods may include etching the silicon-and-germanium-containing material of the alternating layers of material on the substrate.

In some embodiments, the methods may include forming a passivation material on the substrate. The passivation material may include a silicon-fluorine-and-hydrogen-containing material. A temperature within the semiconductor processing chamber may be maintained at less than or about 25° C. The first fluorine-containing precursor may be provided to a remote plasma system of the semiconductor processing chamber. A plasma power in the remote plasma system may be maintained at between about 1000 W and about 3000 W. The methods may include generating plasma effluents of the second fluorine-containing precursor in the processing region of the semiconductor processing chamber. A plasma power in the processing region may be maintained at less than or about 1000 W.

Embodiments of the present technology may encompass semiconductor processing methods. The methods may include providing a first fluorine-containing precursor to a remote plasma system of a semiconductor processing chamber. The methods may include generating plasma effluents of the first fluorine-containing precursor in the remote plasma system. The methods may include providing plasma effluents of the first fluorine-containing precursor to a processing region of the semiconductor processing chamber. The methods may include providing a second fluorine-containing precursor to the processing region of the semiconductor processing chamber. The second fluorine-containing precursor may be a silicon-and-fluorine-containing precursor. A substrate including alternating layers of material is disposed within the processing region. The alternating layers of material may include a silicon-containing material and a first silicon-and-germanium-containing material. The methods may include contacting the substrate with the plasma effluents of the first fluorine-containing precursor and with the second fluorine-containing precursor. A temperature within the semiconductor processing chamber may be maintained at less than or about 25° C. The methods may include forming a passivation material on the substrate. The methods may include etching the first silicon-and-germanium-containing material of the alternating layers of material on the substrate.

In some embodiments, the methods may include providing a third fluorine-containing precursor to the processing region of the semiconductor processing chamber. The third fluorine-containing precursor may be provided on an intermittent basis. The alternating layers of material may be nanowires overlying a second silicon-and-germanium-containing material with a lower germanium content than the first silicon-and-germanium-containing material. The second silicon-and-germanium-containing material may overly a third silicon-and-germanium-containing material with a higher germanium content than the first silicon-and-germanium-containing material.

Such technology may provide numerous benefits over conventional systems and techniques. For example, embodiments of the present technology may etch silicon-and-germanium-containing material at an increased etch rate. Additionally, the silicon-and-germanium-containing material desired to be removed may be etched at a higher selectivity. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
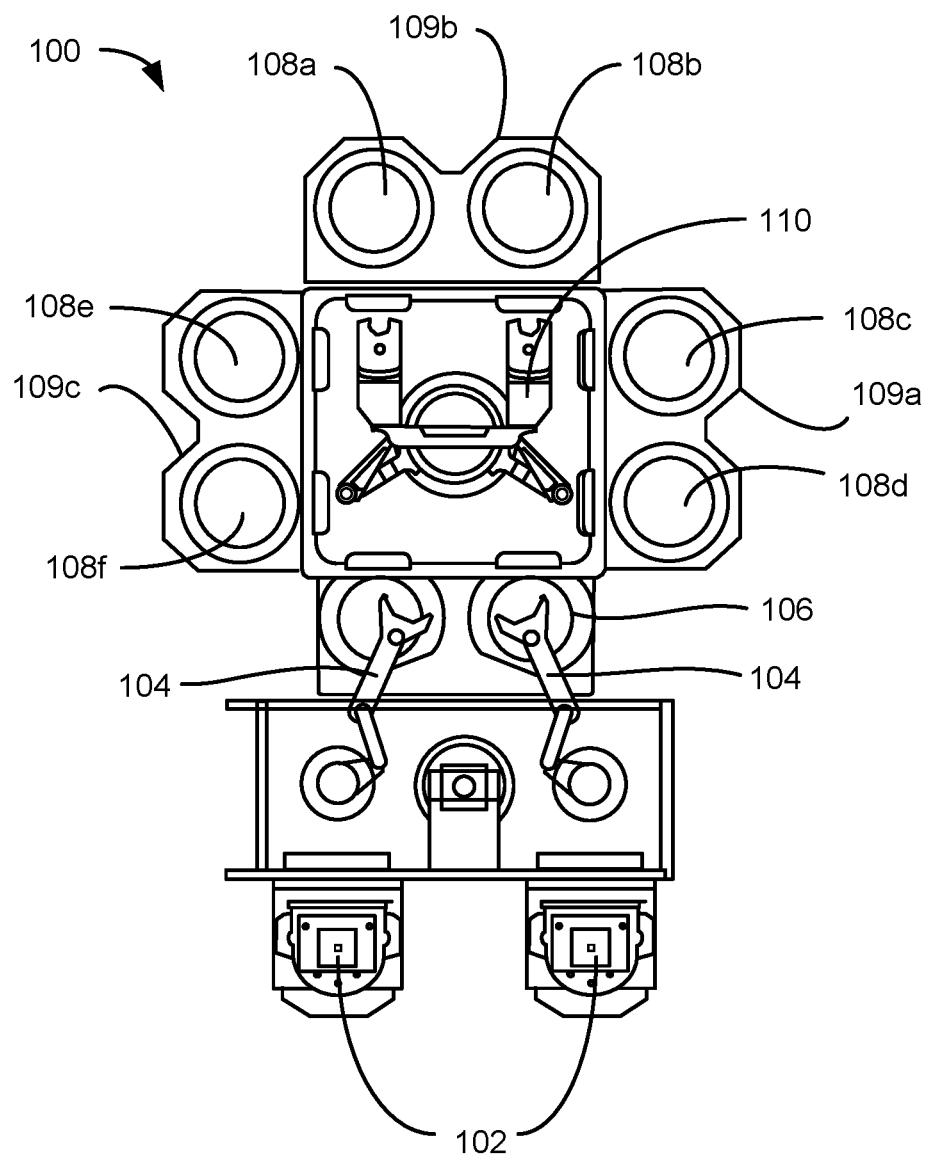
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In semiconductor device processing, a number of materials are used to develop any number of structures and devices. Some materials may be used as placeholder materials and may be removed during subsequent processing operations. In gate all around applications, a silicon-and-germanium-containing material may separate silicon-containing nanowires. The silicon-and-germanium-containing material may be removed or etched during release of the silicon-containing nanowires. Underlying materials, such as a gate structure, may also be a silicon-containing material, such as another silicon-and-germanium-containing material. During release of the silicon-containing nanowires, minimal or zero etching of the gate structure may be necessary.

As device sizes continue to shrink, many material layers may be reduced in thickness and size. The reduced dimensions of these materials, such as the silicon-containing nanowires may frustrate etching operations used to remove placeholder materials, such as the silicon-and-germanium-containing layers disposed between the silicon-containing nanowires. Due to the reduced thicknesses of materials, etch selectivity may decrease and etchants may pass through pinholes in materials to damage underlying materials, such as the gate structure. Conventional technologies have struggled with maintaining selectivity during etching operations and with pitting of the underlying materials, such as the gate structure, which may damage final devices.

The present technology may overcome these issues by performing a more selective etch of the silicon-and-germanium-containing material while limiting the pitting of the underlying gate structure. By providing specific fluorine-containing precursors and by performing the etching at specific process conditions, the etch rate of silicon-containing material may be reduced while the etch rate of silicon-and-germanium-containing material may be increased. Additionally, the combination of certain fluorine-containing precursors may yield a solid passivation material that may protect the silicon-containing material and/or protect etchant species from reaching underlying materials, such as the gate structures. This may advantageously increase the selectivity of the removal of silicon-and-germanium-containing material relative to other materials on the substrate while also preventing fluorine etchants from damaging other materials and structures on the substrate.

Although the remaining disclosure will routinely identify specific etching processes utilizing the disclosed technology, it will be readily understood that the systems and methods are equally applicable to other etch processes, as well as processes as may occur in the described chambers. Accordingly, the technology should not be considered to be so limited as for use with these specific etch processes or chambers alone. The disclosure will discuss one possible system and chamber that may include components according to some embodiments of the present technology before processes and parameters according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a film on the substrate. In one configuration, two pairs of the processing chambers, e.g., 108c-d and 108e-f, may be used to deposit material on the substrate, and the third pair of processing chambers, e.g., 108a-b, may be used to etch the deposited material. In another configuration, all three pairs of chambers, e.g., 108a-f, may be configured to deposit stacks of alternating films on the substrate. Any one or more of the processes described may be carried out in chambers separated from the fabrication system shown in different embodiments. It will be appreciated that additional configurations of deposition, etching, annealing, and curing chambers for various films are contemplated by system 100.

Figure 2:
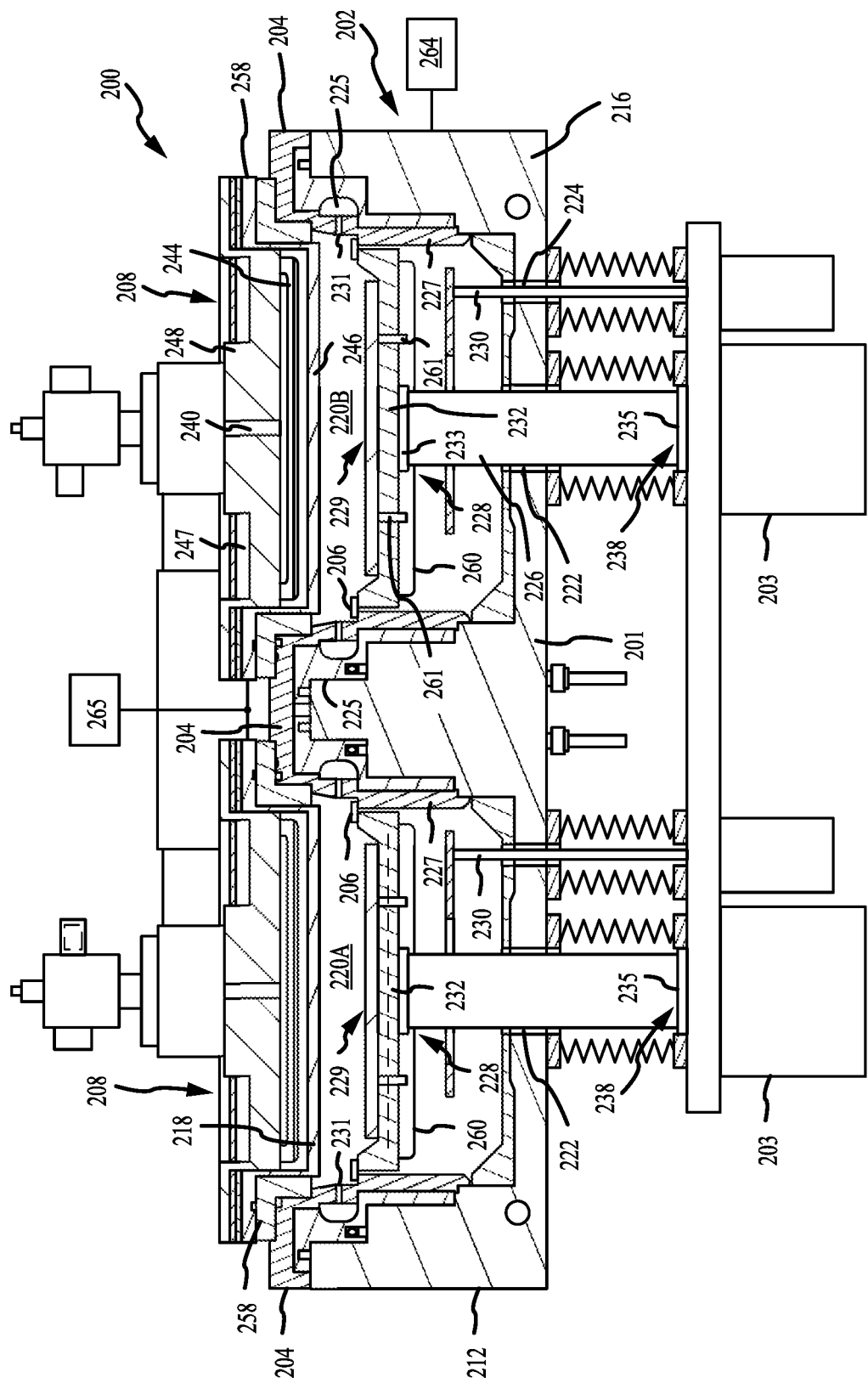
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
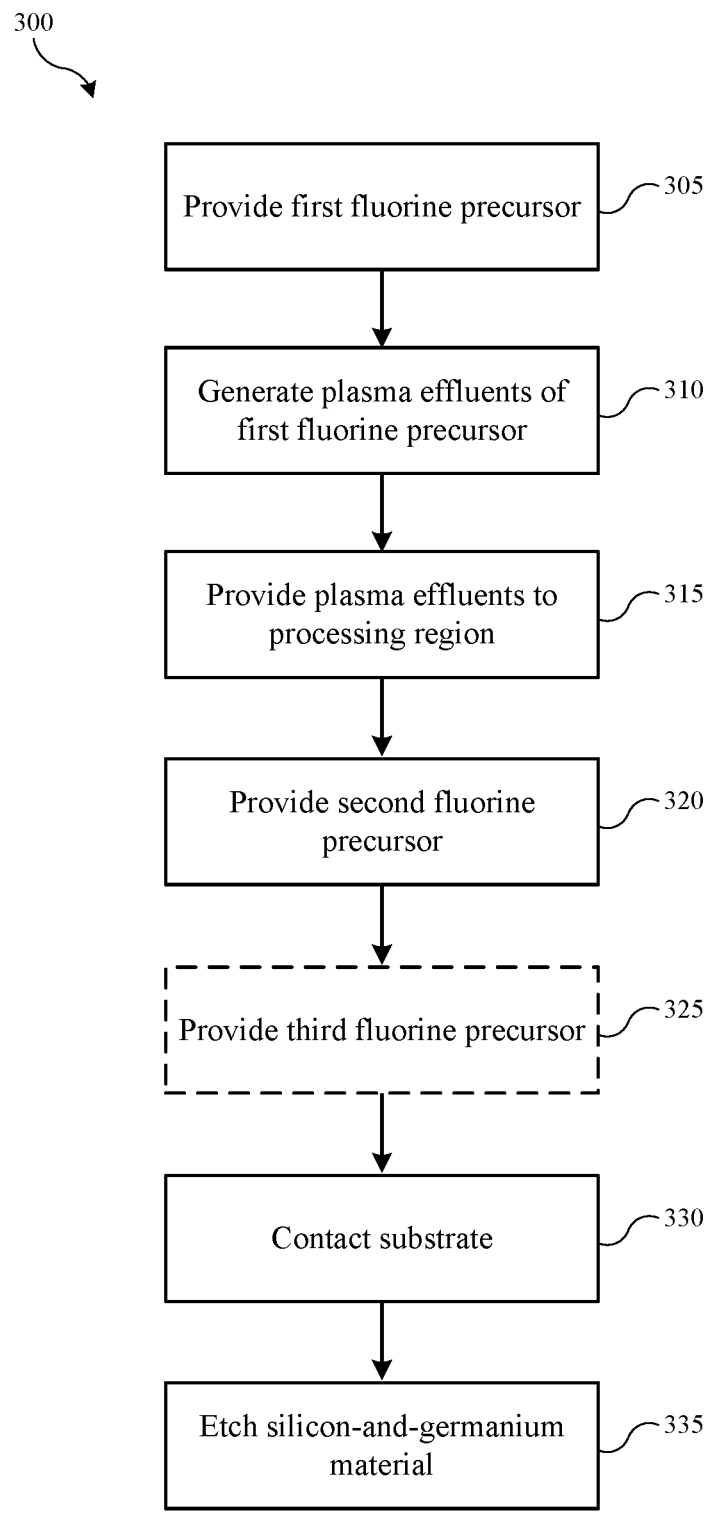
FIG. 3 shows operations of an exemplary method of semiconductor processing according to some embodiments of the present technology.

The chamber discussed previously may be used in performing exemplary methods including etching methods. Turning to FIG. 3 is shown operations of an exemplary method 300 of semiconductor processing according to some embodiments of the present technology. The method may be performed in a variety of processing chambers, including processing system 200 described above, which may include any features or components as previously described. Method 300 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated. Method 300 may describe operations shown schematically in FIGS. 4A-4B, the illustrations of which will be described in conjunction with the operations of method 300. It is to be understood that the figures illustrate only partial schematic views, and a substrate may contain any number of additional materials and features having a variety of characteristics and aspects as illustrated in the figures.

Figure 4A:
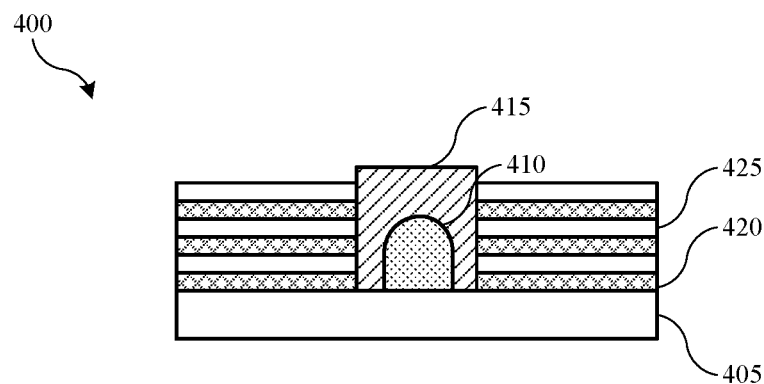
FIGS. 4A-4B show schematic cross-sectional views of semiconductor processing according to some embodiments of the present technology.

Method 300 may include additional operations prior to initiation of the listed operations. For example, semiconductor processing may be performed prior to initiating method 300 in order to develop the semiconductor structure to a particular fabrication operation. Processing operations may be performed in the chamber or system in which method 300 may be performed, or processing may be performed in separate chambers on the same mainframe or a different system from which method 300 may be performed. It is to be understood that method 300 may be performed on any number of semiconductor structures or substrates 405, as illustrated in FIG. 4A, including exemplary structures on which a silicon-and-germanium-containing material etching operation may be performed. The substrate on which processing may occur may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, sapphire, or any other substrate on which processing may be performed. The substrate may have various dimensions, such as 200 mm or 300 mm diameter wafers, as well as rectangular or square panels.

Figure 4B:
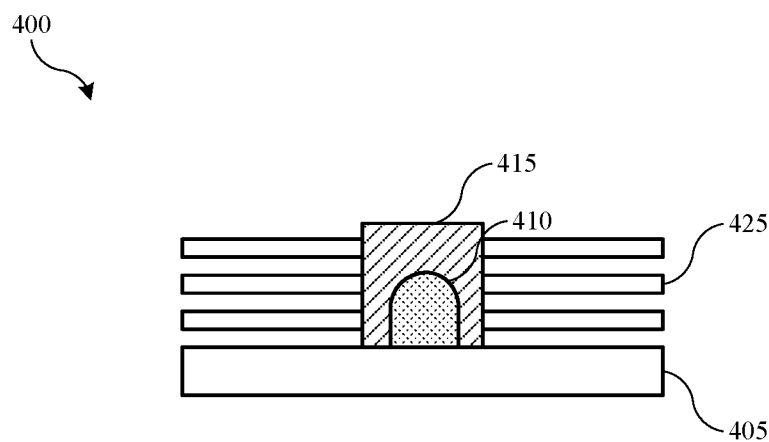

As one non-limiting example encompassed by the present technology in which a silicon-and-germanium-containing material may be selectively removed, a structure 400 as shown in FIG. 4A may be present in a processing region of a semiconductor processing chamber during the methods described herein. Structure 400 may include a substrate 405 having a gate structure 410 overlying the substrate 405. The gate structure 410 may be a silicon-and-germanium-containing material, such as a 40-50 at. % germanium silicon-and-germanium-containing material. Another silicon-and-germanium-containing material 415, such as a 10 at. % germanium silicon-and-germanium-containing material, may overly the gate structure 410. Yet another silicon-and-germanium-containing material 420, such as a 30 at. % germanium silicon-and-germanium-containing material, may extend from silicon-and-germanium-containing material 415. The silicon-and-germanium-containing material 420 may be silicon-and-germanium-containing nanowires. A silicon-containing material 425 may separate the silicon-and-germanium-containing material 420. The silicon-containing material 425 may be silicon-containing nanowires. The silicon-and-germanium-containing material 420 and the silicon-containing material 425 may form alternating layers of material on the substrate 405. As shown in FIG. 4B and to be discussed herein, the silicon-and-germanium-containing material 420 may be etched in the from the structure. The silicon-and-germanium-containing material 420 may be etched selective to the other materials present on the substrate 405.

At operation 305, method 300 may include providing a first fluorine-containing precursor. An exemplary first fluorine-containing precursor may be nitrogen trifluoride (NF$_3$), which may be flowed into the remote plasma system or remote plasma region, which may be separate from, but fluidly coupled with, the processing region of the semiconductor processing chamber. Other sources of fluorine may be used in conjunction with or as replacements for the nitrogen trifluoride. In general, a fluorine-containing precursor may be flowed into the remote plasma region and the first fluorine-containing precursor may include at least one precursor selected from the group of atomic fluorine, diatomic fluorine, nitrogen trifluoride, carbon tetrafluoride, hydrogen fluoride including anhydrous hydrogen fluoride, xenon difluoride, and various other fluorine-containing precursors used or useful in semiconductor processing. The first fluorine-containing precursor may be provided with any number of carrier gases, which may include nitrogen, helium, argon, or other noble, inert, or useful precursors.

The flow rate of the first fluorine-containing precursor may be between about 1 sccm and about 500 sccm. Additionally, the flow rate of the first fluorine-containing precursor may be at least or about 10 sccm, at least or about 25 sccm, at least or about 50 sccm, at least or about 100 sccm, at least or about 150 sccm, at least or about 200 sccm, at least or about 250 sccm, at least or about 300 sccm, at least or about 400 sccm, or more. The flow rate may also be between any of these stated flow rates, or within smaller ranges encompassed by any of these numbers.

At operation 310, method 300 may include generating plasma effluents of the first fluorine-containing precursor in the remote plasma system or remote plasma region. Generating plasma effluents of the first fluorine-containing precursor in the remote plasma system or remote plasma region may form fluorine radicals and/or diatomic fluorine. A plasma power applied to the remote plasma system or remote plasma region may be between about 500 W and about 3000 W. Additionally, the plasma power applied to the remote plasma system or remote plasma region may be greater than or about 750 W, greater than or about 1000 W, greater than or about 1250 W, greater than or about 1500 W, greater than or about 1750 W, greater than or about 2000 W, greater than or about 2250 W, greater than or about 2500 W, greater than or about 2750 W, or more. The plasma power applied to the remote plasma system or remote plasma region may also be between any of these stated plasma powers, or within smaller ranges encompassed by any of these numbers.

At operation 315, method 300 may include providing plasma effluents of the first fluorine-containing precursor, including fluorine radicals and/or diatomic fluorine, to the processing region of the semiconductor processing chamber. Along with the plasma effluents of the first fluorine-containing precursor, method 300 may include providing a second fluorine-containing precursor to the processing region of the semiconductor processing chamber at operation 320.

An exemplary second fluorine-containing precursor may be silicon tetrafluoride (SiF$_4$), which may be flowed into the processing region of the semiconductor processing chamber. Other sources of fluorine may be used in conjunction with or as replacements for the silicon tetrafluoride. In general, a fluorine-containing precursor may be flowed into the processing region and the second fluorine-containing precursor may include at least one precursor selected from the group of atomic fluorine, diatomic fluorine, silicon tetrafluoride, carbon tetrafluoride, hydrogen fluoride including anhydrous hydrogen fluoride, germanium tetrafluoride, xenon difluoride, and various other fluorine-containing precursors used or useful in semiconductor processing. The second fluorine-containing precursor may be provided with hydrogen, such as diatomic hydrogen. The second fluorine-containing precursor may be provided with any number of carrier gases, which may include nitrogen, helium, argon, or other noble, inert, or useful precursors.

The flow rate of the second fluorine-containing precursor may be between about 1 sccm and about 2000 sccm. Additionally, the flow rate of the second fluorine-containing precursor may be at least or about 10 sccm, at least or about 25 sccm, at least or about 50 sccm, at least or about 100 sccm, at least or about 200 sccm, at least or about 300 sccm, at least or about 400 sccm, at least or about 500 sccm, at least or about 600 sccm, at least or about 700 sccm, at least or about 800 sccm, at least or about 900 sccm, at least or about 1000 sccm, at least or about 1200 sccm, at least or about 1400 sccm, at least or about 1600 sccm, at least or about 1800 sccm, or more. In embodiments, the flow rate of the second fluorine-containing precursor may be less than or about 1000 sccm, less than or about 900 sccm, less than or about 800 sccm, less than or about 700 sccm, less than or about 600 sccm, less than or about 500 sccm, less than or about 400 sccm, less than or about 300 sccm, less than or about 200 sccm, less than or about 100 sccm, less than or about 50 sccm, less than or about 25 sccm, less than or about 10 sccm, or less. The flow rate may also be between any of these stated flow rates, or within smaller ranges encompassed by any of these numbers.

In embodiments, method 300 may include providing a third fluorine-containing precursor to the processing region of the semiconductor processing chamber with the second fluorine-containing precursor at optional operation 325. An exemplary third fluorine-containing precursor may be hydrogen fluoride (HF), which may be flowed into the processing region of the semiconductor processing chamber. Other sources of fluorine may be used in conjunction with or as replacements for the hydrogen fluoride (HF). In general, a fluorine-containing precursor may be flowed into the processing region and the third fluorine-containing precursor may include at least one precursor selected from the group of atomic fluorine, diatomic fluorine, fluorocarbons including carbon tetrafluoride and $C_5F_{12}$, hydrogen fluoride including anhydrous hydrogen fluoride, germanium tetrafluoride, xenon difluoride, and various other fluorine-containing precursors used or useful in semiconductor processing. The third fluorine-containing precursor may be provided with any number of carrier gases, which may include nitrogen, helium, argon, or other noble, inert, or useful precursors.

The flow rate of the third fluorine-containing precursor may be between about 1 sccm and about 1000 sccm. Additionally, the flow rate of the third fluorine-containing precursor may be at least or about 10 sccm, at least or about 25 sccm, at least or about 50 sccm, at least or about 100 sccm, at least or about 200 sccm, at least or about 300 sccm, at least or about 400 sccm, at least or about 500 sccm, at least or about 600 sccm, at least or about 700 sccm, at least or about 800 sccm, at least or about 900 sccm, or more. The flow rate may also be between any of these stated flow rates, or within smaller ranges encompassed by any of these numbers.

In embodiments, a flow rate of the third fluorine-containing precursor may be pulsed. That is, the third fluorine-containing precursor may be provided on a discontinuous basis, such that the flow rate is on for a period of time followed by being off for a period of time. The third fluorine-containing precursor, such as hydrogen fluoride, may be provided intermittently such that a passivation material may be formed, as described below, while limiting interaction of the third fluorine-containing precursor with other materials on the substrate 405. A duration for the pulse may be less than or about 30 seconds, less than or about 15 seconds, less than or about 10 seconds, less than or about 9 seconds, less than or about 8 seconds, less than or about 7 seconds, less than or about 6 seconds, less than or about 5 seconds, less than or about 4 seconds, less than or about 3 seconds, less than or about 2 seconds, less than or about 1 seconds, or less. The duration of the period of off time may be greater than or about 5 seconds, greater than or about 6 seconds, greater than or about 7 seconds, greater than or about 8 seconds, greater than or about 9 seconds, greater than or about 10 seconds, greater than or about 15 seconds, greater than or about 30 seconds, or more. The duration of the pulse and/or the period of off time may also be between any of these stated times, or within smaller ranges encompassed by any of these numbers.

In embodiments, method 300 may include forming plasma effluents of the second fluorine-containing precursor and, if present, the third fluorine-containing precursor. Forming plasma effluents may create fluorine radicals, similar to the remote plasma of the first fluorine-containing precursor, which may etch the silicon-and-germanium-containing material 420. A plasma power applied to the processing region may be between about 50 W and about 1000 W. Additionally, the plasma power applied to the remote plasma system or remote plasma region may be less than or about 900 W, less than or about 800 W, less than or about 700 W, less than or about 600 W, less than or about 500 W, less than or about 400 W, less than or about 300 W, less than or about 200 W, less than or about 100 W, or less. The plasma power applied to the processing region may also be between any of these stated plasma powers, or within smaller ranges encompassed by any of these numbers. However, it is also contemplated that no plasma power is provided to the processing region during method 300.

At operation 330, method 300 may include contacting the substrate with the plasma effluents of the first fluorine-containing precursor and with the second fluorine-containing precursor and, if present, the third fluorine-containing precursor. As shown in FIG. 4B, at operation 335, method 300 may include etching the silicon-and-germanium-containing material 420 of the alternating layers of material on the substrate 405. During operation 335, the diatomic fluorine and fluorine radicals produced from the first fluorine-containing precursor, the second fluorine-containing precursor and/or, the fluorine-containing precursor, if present, may react with structure 400 to etch the silicon-and-germanium-containing material 420. Specifically, the diatomic fluorine may interact with the silicon-and-germanium-containing material 420 to produce silicon tetrafluoride and/or germanium tetrafluoride. Simultaneously, the fluorine radicals may interact with the silicon-and-germanium-containing material 420 to also produce silicon tetrafluoride and/or germanium tetrafluoride. The fluorine radicals may also interact with the silicon-containing material 425 to also produce silicon tetrafluoride.

During method 300, the fluorine-containing precursors may interact with each other and with the structure 400 to increase selectivity of the removal of silicon-and-germanium-containing material 420 relative to silicon-containing material 425. Furthermore, the fluorine-containing precursors may limit pitting or removal of other silicon-and-germanium-containing materials, such as the gate structure 410. The selectivity may be increased by providing the second fluorine-containing precursor, such as silicon tetrafluoride. The addition of silicon tetrafluoride may reduce the etching of the silicon-containing material 425. As discussed, silicon tetrafluoride is a product of the reaction between fluorine radicals of the fluorine-containing precursors and the silicon-containing material 425. Therefore, the increased presence of silicon tetrafluoride in the processing region may slow down the reaction between fluorine radicals of the fluorine-containing precursors and the silicon-containing material 425. Furthermore, silicon tetrafluoride is a relatively large molecule compared to diatomic fluorine, fluorine radicals, and other fluorine materials that may be present. The size of silicon tetrafluoride may block pinholes in the silicon-and-germanium-containing material 415, preventing the fluorine-containing precursors from penetrating the silicon-and-germanium-containing material 415 and etching or pitting the underlying gate structure 410.

In addition to the reduced etch rate of the silicon-containing material 425 and the reduced etching or pitting of the gate structure 410, method 300 may include forming a passivation material. The passivation material may be formed on the substrate 405 or the materials disposed thereon, such as the silicon-containing material 425. During method 300, the precursors provided to the processing region may form a solid passivation material that may protect materials not to be etched. For example, the second fluorine-containing precursor, such as silicon tetrafluoride, and the third fluorine-containing precursor, such as hydrogen fluoride, may react to form a solid material that passivates the silicon-containing material 425 and/or the silicon-and-germanium-containing material 415. The passivation material may be a silicon-fluorine-and-hydrogen-containing material. The passivation material may further reduce the etching of the silicon-containing material 425, which may further increase the selectivity. The passivation material may also prevent or reduce fluorine from reaching the gate structure 410 by passivating the silicon-and-germanium-containing material 415.

The present technology may selectively etch silicon-and-germanium-containing material compared to other materials, and may selectively etch some types of silicon-and-germanium-containing material relative to other types of silicon-and-germanium-containing material. For example, the present technology may etch silicon-and-germanium-containing material relative to silicon-containing material at a rate of at least about 10:1, and may etch silicon-and-germanium-containing material relative to silicon-containing material at a rate of at least about 15:1, at least about 20:1, at least about 50:1, at least about 75:1, at least about 100:1, or more. The present technology may also etch silicon-and-germanium-containing material, such as a 30 at. % germanium silicon-and-germanium-containing material, relative to other silicon-and-germanium-containing material, such as a 10 at. % germanium silicon-and-germanium-containing material, at a rate of at least about 1:1, at least about 5:1, at least about 10:1, at least about 15:1, at least about 20:1, at least about 25:1, at least about 30:1, at least about 50:1, or more.

In embodiments, the present technology may be characterized by an increased etch rate of the silicon-and-germanium-containing material 420 compared to conventional processes. The addition of the second fluorine-containing precursor and/or the third fluorine-containing precursor may increase the etch rate of the silicon-and-germanium-containing material 420 to greater than or about 100 Å/min, such as greater than or about 125 Å/min, greater than or about 150 Å/min, greater than or about 175 Å/min, greater than or about 200 Å/min, greater than or about 225 Å/min, or more. However, at high flow rates of the fluorine-containing precursors, the etch rate of the silicon-and-germanium-containing material 420 may decrease due to dilution. The dilution may be due at least in part to the increased presence of gas in the processing region.

Process conditions may also impact the operations performed in method 300. Each of the operations of method 300 may be performed during a constant temperature in embodiments, while in some embodiments the temperature may be adjusted during different operations. For example, the substrate, pedestal, or chamber temperature during the method 300 may be maintained below or about 50° C. in embodiments. The substrate temperature may also be maintained below or about 45° C., below or about 40° C., below or about 35° C., below or about 30° C., below or about 25° C., below or about 20° C., below or about 15° C., below or about 10° C., below or about 5° C., below or about 0° C., below or about −5° C., below or about −10° C., below or about −15° C., below or about −20° C., below or about −25° C., below or about −30° C., below or about −35° C., below or about −40° C., below or about −45° C., below or about −50° C., or lower. The temperature may also be maintained at any temperature within these ranges, within smaller ranges encompassed by these ranges, or between any of these ranges. As previously discussed, by performing the operations at temperatures below 50° C., a passivation material may form on the silicon-containing material 425 and/or silicon-and-germanium-containing material 415. At higher temperatures, these solid passivation materials may not form, which may result in a reduced selectivity and/or pitting of the gate structure 410. However, lower temperatures may slow down the etch rate of the silicon-and-germanium-containing material due to the activation energy needed to etch the silicon-and-germanium-containing material. Accordingly, the temperature may be maintained at greater than −50° C. to maintain sufficient etch rates.

The pressure within the chamber may also affect the operations performed, and in embodiments the chamber pressure may be at least or about 0.1 Torr, at least or about 0.5 Torr, at least or about 1 Torr, at least or about 2 Torr, at least or about 3 Torr, at least or about 4 Torr, at least or about 5 Torr, at least or about 10 Torr, at least or about 15 Torr, at least or about 20 Torr, or more. The pressure may also be maintained at any pressure within these ranges, within smaller ranges encompassed by these ranges, or between any of these ranges. By performing the operations at pressures above about 0.1 Torr, more diatomic fluorine may be generated than fluorine radicals during dissociation of any of the fluorine-containing precursors. With a decreased amount of fluorine radicals via an increase in diatomic fluorine generation, selectivity may increase. The selectivity may increase because both diatomic fluorine and fluorine radicals may etch the silicon-and-germanium-containing material 420, whereas the diatomic fluorine may not as readily etch the silicon-containing material 425.

The previously discussed methods may allow the removal of silicon-and-germanium-containing material from a substrate while limiting the removal of other materials on the substrate. The operations performed may include providing a combination of fluorine-containing precursors to increase the etch rate of silicon-and-germanium, increase the selectivity of silicon-and-germanium removal, or prevent fluorine from passing through layers of material to underlying layers of material that are not to be etched. Additional chamber operations may also be adjusted as discussed throughout the present disclosure. By utilizing the present methods and operations, highly selective silicon-and-germanium-containing material removal may be achieved while protecting underlying materials from being damaged, unlike conventional etching processes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing method comprising:
   providing a first fluorine-containing precursor to a remote plasma system of a semiconductor processing chamber;
   generating plasma effluents of the first fluorine-containing precursor in the remote plasma system;
   providing plasma effluents of the first fluorine-containing precursor to a processing region of the semiconductor processing chamber;
   providing a second fluorine-containing precursor to the processing region of the semiconductor processing chamber, wherein the second fluorine-containing precursor comprises silicon tetrafluoride ($SiF_4$), and wherein a substrate comprising alternating layers of material is disposed within the processing region, and wherein the alternating layers of material comprise a silicon-and-germanium-containing material;
   contacting the substrate with the plasma effluents of the first fluorine-containing precursor and with the second fluorine-containing precursor; and
   etching the silicon-and-germanium-containing material of the alternating layers of material on the substrate.

2. The semiconductor processing method of claim 1, wherein the first fluorine-containing precursor comprises nitrogen trifluoride ($NF_3$).

3. The semiconductor processing method of claim 1, further comprising:
   providing argon to the remote plasma system with the first fluorine-containing precursor.

4. The semiconductor processing method of claim 1, further comprising:
   providing a third fluorine-containing precursor to the processing region of the semiconductor processing chamber with the second fluorine-containing precursor, wherein the third fluorine-containing precursor comprises hydrogen fluoride (HF).

5. The semiconductor processing method of claim 4, further comprising:
   pulsing a flow rate of the third fluorine-containing precursor.

6. The semiconductor processing method of claim 1, wherein the alternating layers of material further comprise a silicon-containing material.

7. The semiconductor processing method of claim 6, wherein the silicon-and-germanium-containing material is etched at a selectivity relative to the silicon-containing material of greater than 10:1.

8. The semiconductor processing method of claim 1, wherein a flow rate of the second fluorine-containing precursor is maintained at less than or about 500 sccm.

9. The semiconductor processing method of claim 1, wherein a temperature within the semiconductor processing chamber is maintained at less than or about 50° C.

10. The semiconductor processing method of claim 1, wherein the silicon-and-germanium-containing material is etched at an etch rate of greater than or about 100 Å/min.

11. A semiconductor processing method comprising:
    providing a first fluorine-containing precursor and a second fluorine-containing precursor to a processing region of a semiconductor processing chamber, wherein a substrate comprising alternating layers of material is disposed within the processing region, and wherein the alternating layers of material comprise a silicon-containing material and a silicon-and-germanium-containing material;
    contacting the substrate with the first fluorine-containing precursor and with the second fluorine-containing precursor;
    etching the silicon-and-germanium-containing material of the alternating layers of material on the substrate; and
    forming a passivation material on the substrate, wherein the passivation material comprises a silicon-fluorine-and-hydrogen-containing material.

12. The semiconductor processing method of claim 11, wherein a temperature within the semiconductor processing chamber is maintained at less than or about 25° C.

13. The semiconductor processing method of claim 11, wherein the first fluorine-containing precursor is provided to a remote plasma system of the semiconductor processing chamber.

14. The semiconductor processing method of claim 13, wherein a plasma power in the remote plasma system is maintained at between about 1000 W and about 3000 W.

15. The semiconductor processing method of claim 11, further comprising:
    generating plasma effluents of the second fluorine-containing precursor in the processing region of the semiconductor processing chamber, wherein a plasma power in the processing region is maintained at less than or about 1000 W.

16. A semiconductor processing method comprising:
    providing a first fluorine-containing precursor to a remote plasma system of a semiconductor processing chamber;
    generating plasma effluents of the first fluorine-containing precursor in the remote plasma system;
    providing plasma effluents of the first fluorine-containing precursor to a processing region of the semiconductor processing chamber;
    providing a second fluorine-containing precursor to the processing region of the semiconductor processing chamber, wherein the second fluorine-containing precursor comprises a silicon-and-fluorine-containing precursor, wherein a substrate comprising alternating layers of material is disposed within the processing region, and wherein the alternating layers of material comprise a silicon-containing material and a first silicon-and-germanium-containing material;
    contacting the substrate with the plasma effluents of the first fluorine-containing precursor and with the second fluorine-containing precursor, wherein a temperature within the semiconductor processing chamber is maintained at less than or about 25° C.;
    forming a passivation material on the substrate; and
    etching the first silicon-and-germanium-containing material of the alternating layers of material on the substrate at an etch rate of greater than or about 100 Å/min.

17. The semiconductor processing method of claim 16, further comprising:
  providing a third fluorine-containing precursor to the processing region of the semiconductor processing chamber, wherein the third fluorine-containing precursor is provided on an intermittent basis.

18. The semiconductor processing method of claim 16, wherein:
  the alternating layers of material are nanowires overlying a second silicon-and-germanium-containing material with a lower germanium content than the first silicon-and-germanium-containing material; and
  the second silicon-and-germanium-containing material overlies a third silicon-and-germanium-containing material with a higher germanium content than the first silicon-and-germanium-containing material.

* * * * *